United States Patent
Iguchi et al.

(10) Patent No.: US 10,818,618 B2
(45) Date of Patent: Oct. 27, 2020

(54) ADHESIVE SUBSTRATE, TRANSFER DEVICE HAVING ADHESIVE SUBSTRATE, AND METHOD FOR PRODUCING ADHESIVE SUBSTRATE

(71) Applicant: SHIN-ETSU CHEMICAL CO., LTD., Tokyo (JP)

(72) Inventors: Hiroyuki Iguchi, Annaka (JP); Toshio Shiobara, Annaka (JP); Tsutomu Kashiwagi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/444,000

(22) Filed: Jun. 18, 2019

(65) Prior Publication Data

US 2020/0035627 A1     Jan. 30, 2020

(30) Foreign Application Priority Data

Jul. 24, 2018    (JP) .................................. 2018-138527

(51) Int. Cl.
*H01L 21/00* (2006.01)
*H01L 23/00* (2006.01)
(Continued)

(52) U.S. Cl.
CPC ............... *H01L 24/02* (2013.01); *H01B 1/24* (2013.01); *H01B 3/40* (2013.01); *H01L 24/28* (2013.01);
(Continued)

(58) Field of Classification Search
CPC ... H01B 1/22; H01B 1/24; H01L 2221/68368; H01L 21/6835; H01L 21/683
See application file for complete search history.

(56) References Cited

U.S. PATENT DOCUMENTS 5,032,438 A * 7/1991 Sakumoto ............... H01L 24/83
                                                                       428/41.8
8,426,227 B1 * 4/2013 Bibl .......................... H01L 33/06
                                                                       438/27

(Continued)

FOREIGN PATENT DOCUMENTS

JP     2005-209454 A     8/2005
JP     2016-001752 A     1/2016

(Continued)

*Primary Examiner* — Nicholas J Tobergte
(74) *Attorney, Agent, or Firm* — Oliff PLC

(57) ABSTRACT

An adhesive substrate includes a support base member and an adhesive layer provided on the support base member. The support base member contains electroconductive particles and an insulating resin, and has a recessed and projected pattern with two or more projected portions on one surface or both surfaces of the support base member. The adhesive layer is provided at least on upper surfaces of the projected portions in the recessed and projected pattern of the support base member. The adhesive layer on the upper surfaces of the projected portions has an upper surface with a curved surface. Thus, the present invention provides an adhesive substrate capable of selectively picking up and quickly transferring large amounts of fine chips and particles, a method for producing the adhesive substrate, and a transfer device.

20 Claims, 4 Drawing Sheets

(51) Int. Cl.
  *H01B 3/40*   (2006.01)
  *H01B 1/24*   (2006.01)
  *H01L 23/498*  (2006.01)
  *H01L 21/683*  (2006.01)

(52) U.S. Cl.
  CPC ........ *H01L 21/683* (2013.01); *H01L 21/6835* (2013.01); *H01L 23/49838* (2013.01); *H01L 23/49894* (2013.01); *H01L 2224/03312* (2013.01); *H01L 2224/8685* (2013.01)

(56) References Cited

U.S. PATENT DOCUMENTS

| | | | |
|---|---|---|---|
| 9,425,163 B2* | 8/2016 | Schmidt-Lange | H01L 24/81 |
| 9,548,332 B2* | 1/2017 | Hu | H01L 27/156 |
| 9,847,314 B2* | 12/2017 | Wasserman | B23K 1/008 |
| 10,355,166 B2* | 7/2019 | Jeung | H01L 33/0093 |
| 2012/0027557 A1* | 2/2012 | Ashdown | H01L 24/83 |
| | | | 414/800 |
| 2014/0061970 A1* | 3/2014 | Sekine | C09D 151/006 |
| | | | 264/293 |
| 2016/0043053 A1 | 2/2016 | Seyama | |
| 2019/0162374 A1* | 5/2019 | Oyer | F21S 4/24 |

FOREIGN PATENT DOCUMENTS

| | | |
|---|---|---|
| WO | 2014/098174 A1 | 6/2014 |
| WO | 2016/012409 A2 | 1/2016 |

\* cited by examiner

[FIG. 1]
(A) 100A
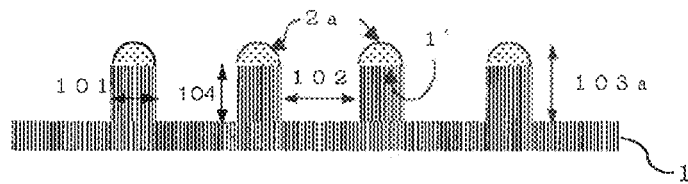
(B) 100B
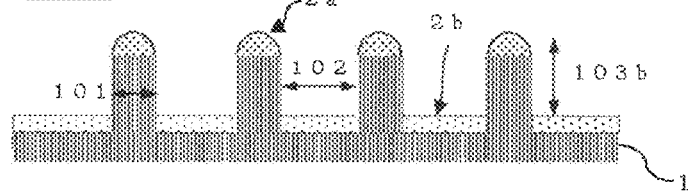
[FIG. 2]
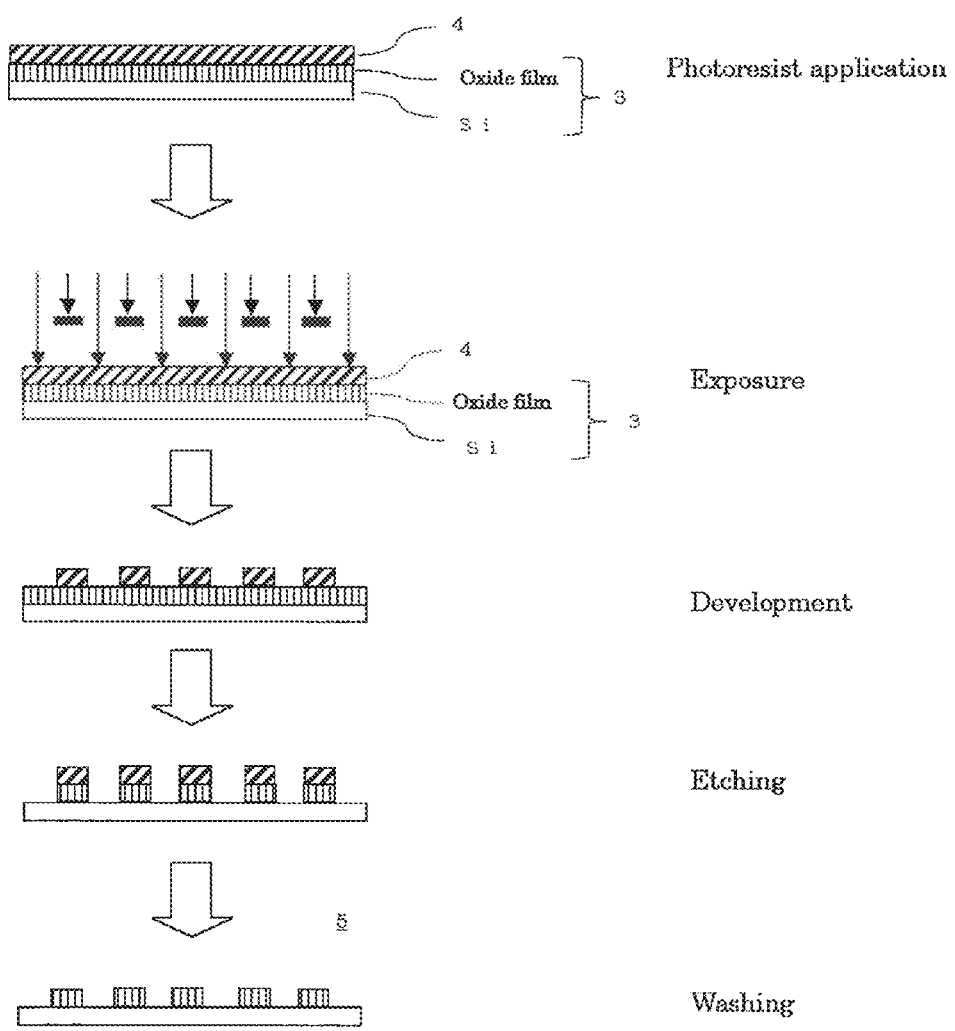

[FIG. 3]
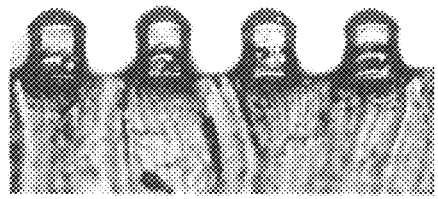
[FIG. 4]
[FIG. 5]
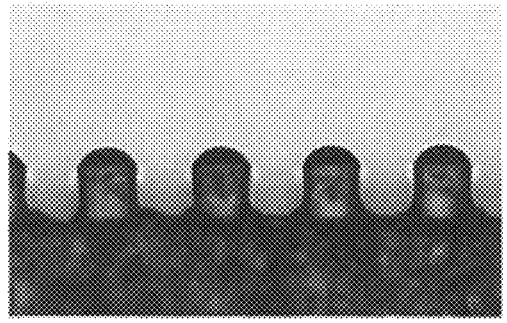
[FIG. 6]
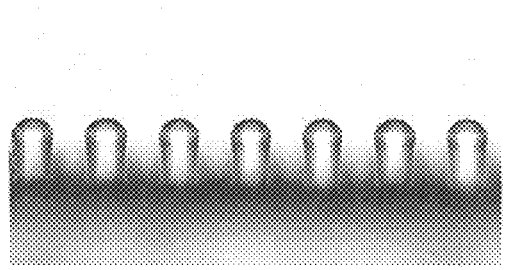
[FIG. 7]
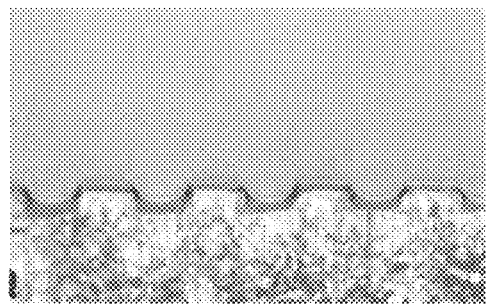

[FIG. 8]
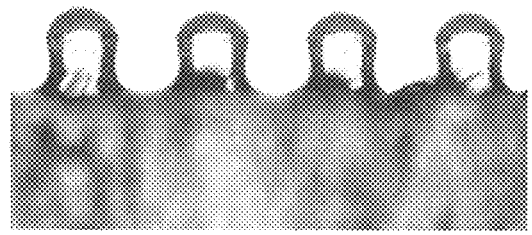
[FIG. 9]
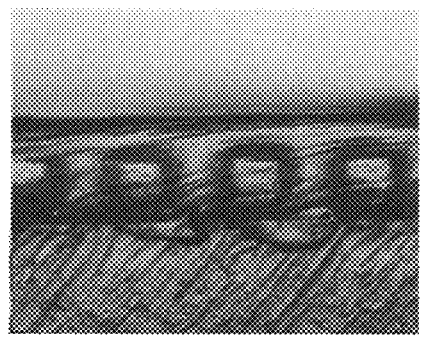
[FIG. 10]
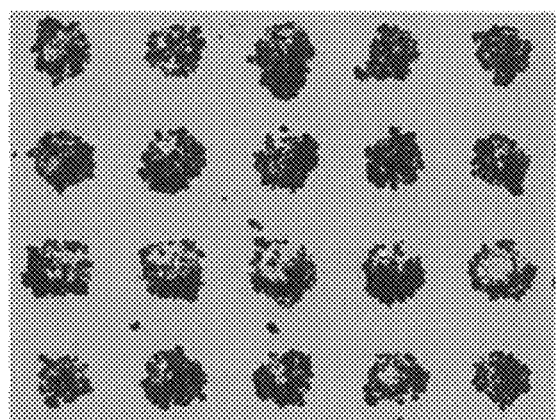
[FIG. 11]
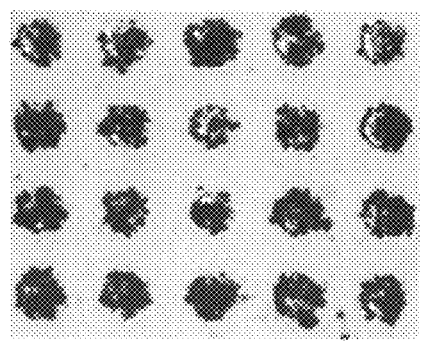

[FIG. 12]
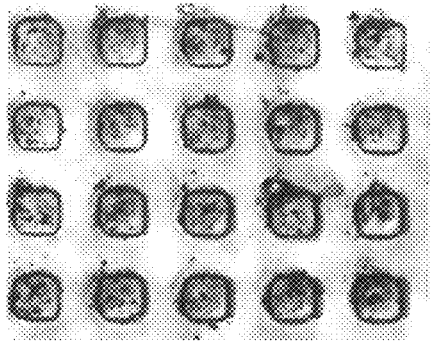
[FIG. 13]
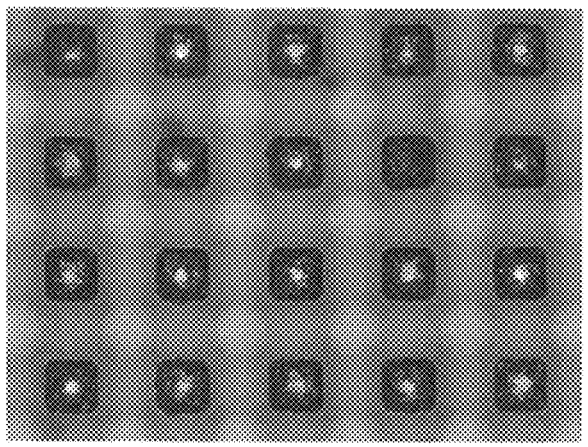
[FIG. 14]
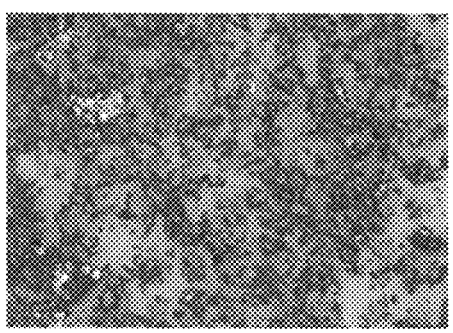
[FIG. 15]
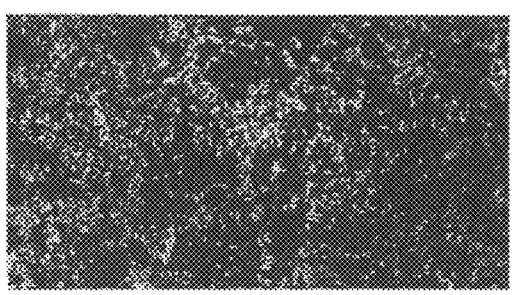

ADHESIVE SUBSTRATE, TRANSFER DEVICE HAVING ADHESIVE SUBSTRATE, AND METHOD FOR PRODUCING ADHESIVE SUBSTRATE

TECHNICAL FIELD

The present invention relates to an adhesive substrate, a transfer device having the adhesive substrate, and a method for producing the adhesive substrate.

BACKGROUND ART

In recent years, size and weight reductions of electronic devices, mainly portable devices such as watches and cellular phones, have been progressing. Accordingly, downsizing of semiconductor chips incorporated into these electronic devices have also been progressing more and more.

Heretofore, wire bonding has been known as a method for connecting a lead wire to an electrode of a semiconductor chip. However, the space occupied by such wires is so large that this method is unsuitable for downsizing semiconductor chips.

Hence, flip chip bonding is employed in which the upper surface with an electrode is turned over and directly connected to an electrode substrate (Patent Documents 1, 2). This method enables the downsizing because no wire is formed. Nevertheless, in such a conventional method, since chips are picked up one one, it takes quite a long time in the event of die bonding for a large amount of very small chips such as micro LEDs.

In a transferring member described in Patent Document 3, an adhesive layer adheres to a projected portion in a recessed and projected pattern so as to form a flat surface. Nevertheless, when such a transferring member is brought into contact with chips, the area where the flat-surface adhesive layer is in contact with the chips is large. Hence, when the chips are picked up and disposed on a different adhesive substrate, it is difficult to transfer all the chips completely to the different adhesive substrate. In addition, due to the large area where the flat-surface adhesive layer is in contact with the chip, the process is complicated because, for example, the speed of picking up chips is different from the speed of transferring the chips to the different adhesive substrate.

Moreover, recently, Anisotropic Conductive Films (ACF) have been used instead of solder for a flat panel display such as a Liquid Crystal Display (LCD) or in connecting electronic parts in a precision instrument with each other. The anisotropic conductive film is composed of electroconductive particles and an insulating resin, and is disposed between circuit electrodes to bring contact bonding by pressing and heating, thereby making it possible to electrically connect the circuits.

For example, in Patent Document 4, an anisotropic conductive film is produced by: introducing a porous plate into a vessel that contains electroconductive particles, the porous plate having pores smaller than the particle size of the electroconductive particles; reducing the pressure of the side being separated by the porous plate and opposite to the side that contains the electroconductive particles to capture the electroconductive particles on the porous plate; and transferring the electroconductive particles onto a substrate. However, it is necessary to, for example, reduce the pressure of the side opposite to the side that contains the electroconductive particles and separated by the porous plate, thereby increasing the number of steps, and increasing the cost extremely. As described above, it has been difficult to regularly dispose electroconductive particles in a simple manner.

CITATION LIST

Patent Literature

Patent Document 1: Japanese Unexamined Patent Application Publication No. 2016-001752
Patent Document 2: International Patent Laid-Open Publication No. WO 2014/098174
Patent Document 3: International Patent Laid-Open Publication No. WO 2016/012409
Patent Document 4: Japanese Unexamined Patent Application Publication No. 2005-209454

SUMMARY OF INVENTION

Technical Problem

The present invention has been made in view of the above-described circumstances. An object of the present invention is to provide an adhesive substrate capable of selectively picking up and quickly transferring large amounts of fine chips and particles, a method for producing the adhesive substrate, and a transfer device.

Solution to Problem

To achieve the object, the present invention provides an adhesive substrate comprising:
  a support base member; and
  an adhesive layer provided on the support base member,
  wherein the support base member contains electroconductive particles and an insulating resin, and has a recessed and projected pattern with two or more projected portions on one surface or both surfaces of the support base member,
  the adhesive layer is provided at least on upper surfaces of the projected portions in the recessed and projected pattern of the support base member, and
  the adhesive layer on the upper surfaces of the projected portions has an upper surface with a curved surface.

The inventive adhesive substrate is capable of selectively picking up and quickly transferring (die-bonding) a large amount of fine chips. Moreover, the inventive adhesive substrate is capable of selectively picking up electroconductive nanoparticles and transferring them onto a different adhesive substrate, adhesive tape or the like to dispose them in a short time.

Moreover, in this case, a difference between a height of the upper surfaces of the projected portions of the support base member and a height of a bottom surface of a recessed portion in the recessed and projected pattern of the support base member is preferably 50 to 500% of a width of the projected portions.

Such an adhesive substrate is preferable because the recessed and projected portions are so adequate that large amounts of fine chips and particles can be regular transferred.

Further, the projected portions adjacent to each other in the recessed and projected pattern of the support base member preferably have an interval of 1 μm to 100 μm.

Further, the projected portions in the recessed and projected pattern of the support base member each preferably have a width of 1 μm to 100 μm.

Such an interval between the adjacent projected portions of the support base member and a width of the projected portion are preferable because fine chips and so forth can be selectively picked up reliably.

The adhesive layer may be provided only on the upper surfaces of the projected portions in the recessed and projected pattern of the support base member.

Meanwhile, the adhesive layer may be provided also on the recessed portion of the support base member such that a height of an upper surface of the adhesive layer provided on the recessed portion is lower than a height of the upper surface of the adhesive layer provided on the upper surfaces of the projected portions.

The inventive adhesive substrate includes these specific aspects. Such adhesive substrates can selectively pick up and quickly transfer large amounts of fine chips and so forth, reliably.

Moreover, in this case, a difference between a height of the upper surface of the adhesive layer provided on the upper surfaces of the projected portions of the support base member and the height of the bottom surface of the recessed portion is preferably at most 1 μm to 100 μm.

Meanwhile, a difference between the height of the upper surface of the adhesive layer provided on the upper surfaces of the projected portions of the support base member and the height of the upper surface of the adhesive layer provided on the recessed portion of the support base member is preferably at most 1 μm to 100 μm.

Such distances between the upper surface of the adhesive layer provided on the upper surfaces of the projected portions of the support base member and the bottom surface of the recessed portion of the support base member or the upper surface of the adhesive layer provided on the recessed portion more reliably make it possible to selectively pick up large amounts of fine chips and particles and transfer large amounts of chips and particles in a short time.

Additionally, the adhesive layer preferably has a maximum thickness of 0.01 μm to 100 μm.

The adhesive layer having such a maximum thickness (height) is preferable because when the adhesive substrate is pressed to chips and so forth, the deformation amount is small.

Moreover, in this case, the support base member preferably contains 10 to 90 parts by mass of the electroconductive particles based on 100 parts by mass of a total amount of the electroconductive particles and the insulating resin.

When the support base member contains 10 parts by mass or more of the electroconductive particles as described above, it is certain that the surface of the base member is hardly charged with static electricity. Additionally, when the adhesive layer picks up electroconductive nanoparticles, the particles will not adhere to the other location than the adhesive layer. The content of 90 parts by mass or less is preferable because the support base member can be prepared neatly.

In addition, the electroconductive particles preferably have a median diameter of 0.01 μm to 100 μm measured with a particle size distribution measuring device by a laser diffraction method.

The electroconductive particles having a median diameter within this range are preferable because the electroconductive particles can also enter the projected portion in the recessed and projected pattern of the support base member.

The adhesive layer preferably has an adhesive force of 0.05 to 50 (N/25 mm width), the adhesive force being measured when the adhesive layer is peeled in accordance with JIS Z 0237: 2009 under conditions of 23° C., a peel angle of 180°, and a peel rate of 300 mm/min.

In the present invention, the adhesive force of the adhesive layer within this range is preferable because the adhesive layer has a sufficient adhesiveness to pick up micro chips.

Additionally, the present invention provides a transfer device comprising the adhesive substrate as a transferring member.

The inventive adhesive substrate is capable of selectively picking up a large amount of fine chips and die-bonding a large amount of chips in a short time, and is thus useful as a transferring member of a micro-LED transfer device. Moreover, since electroconductive nanoparticles can adhere to the adhesive layer of the inventive adhesive substrate, the inventive adhesive substrate is usable as a transferring member of a transfer device for manufacturing an anisotropic conductive substrate, too.

Furthermore, the present invention provides a method for producing an adhesive substrate, comprising applying an adhesive agent through a nozzle by electrostatic force to form the adhesive layer at least on the upper surfaces of the projected portions of the support base member.

In this manner, applying an adhesive agent by electrostatic force makes it possible to produce the inventive adhesive substrate in a short time in which the adhesive layer having the curved upper surface is provided on the upper surfaces of the projected portions of the support base member.

Advantageous Effects of Invention

The inventive adhesive substrate has a recessed and projected pattern disposed on the surface of the support base member. The adhesive layer is provided at least on the upper surfaces of the projected portions in the recessed and projected pattern of the support base member, and the adhesive layer on the upper surfaces of the projected portions has a curved surface. Thus, the inventive adhesive substrate is capable of selectively picking up a large amount of fine chips and die-bonding a large amount of chips in a short time. In addition, the support base member is blended with the electroconductive particles, and is thus hardly charged with static electricity. Accordingly, chip failure due to static electricity, chip scattering by electrostatic repulsion, and so forth hardly occur. Hence, the inventive adhesive substrate is useful as a transferring member of a transfer device for transferring chips. Further, the inventive adhesive substrate allows electroconductive nanoparticles to selectively adhere to the adhesive layer; in addition, the inventive adhesive substrate inhibits the electroconductive nanoparticles from adhering due to static electricity. Accordingly, the electroconductive nanoparticles can be disposed at equal intervals in a short time by transferring the electroconductive nanoparticles to a different adhesive substrate or the like. Hence, the inventive adhesive substrate can be used as a transferring member of a transfer device for manufacturing an anisotropic conductive substrate, too.

BRIEF DESCRIPTION OF DRAWINGS

FIG. 1 shows a schematic sectional view (A) for illustrating an embodiment of an adhesive substrate of the present invention, and a schematic sectional view (B) for illustrating another embodiment of the inventive adhesive substrate.

FIG. 2 is a flow diagram for explaining a lithographic process for preparing a mold having a recessed and projected pattern.

FIG. 3 is a photograph of an adhesive substrate produced in Example 1, in which projected portions of a support base member have a width of 30 μm and an interval of 30 μm, the height difference is 30 μm between upper surfaces of the projected portions and bottom surfaces of recessed portions, and an adhesive layer has a thickness of 10 μm.

FIG. 4 is a photograph of an adhesive substrate produced in Example 2, in which projected portions of a support base member have a width of 20 μm and an interval of 50 μm, the height difference is 40 μm between upper surfaces of the projected portions and bottom surfaces of recessed portions, and an adhesive layer has a thickness of 8 μm.

FIG. 5 is a photograph of an adhesive substrate produced in Example 3, in which projected portions of a support base member have a width of 50 μm and an interval of 100 μm, the height difference is 70 μm between upper surfaces of the projected portions and bottom surfaces of recessed portions, and an adhesive layer has a thickness of 20 μm.

FIG. 6 is a photograph of an adhesive substrate produced in Example 4, in which projected portions of a support base member have a width of 40 μm and an interval of 50 μm, the height difference is 100 μm between upper surfaces of the projected portions and bottom surfaces of recessed portions, and an adhesive layer has a thickness of 20 μm.

FIG. 7 is a photograph of an adhesive substrate produced in Example 5, in which projected portions of a support base member have a width of 30 μm and an interval of 30 μm, the height difference is 10 μm between upper surfaces of the projected portions and bottom surfaces of recessed portions, and an adhesive layer has a thickness of 5 μm.

FIG. 8 is a photograph of an adhesive substrate produced in Comparative Example 1, which contains no electroconductive particles, and in which projected portions of a support base member have a width of 30 μm and an interval of 30 μm, the height difference is 30 μm between upper surfaces of the projected portions and bottom surfaces of recessed portions, and an adhesive layer has a thickness of 10 μm.

FIG. 9 is a photograph of an adhesive substrate produced in Comparative Example 2, in which an adhesive layer is formed on a support base member with a hand spray gun, projected portions have a width of 30 μm and an interval of 30 μm, and the height difference is 30 μm between upper surfaces of the projected portions and bottom surfaces of recessed portions.

FIG. 10 is a photograph taken after particles were transferred to a silicone adhesive tape by using the adhesive substrate produced in Example 1.

FIG. 11 is a photograph taken after particles were transferred to a silicone adhesive tape by using the adhesive substrate produced in Example 2.

FIG. 12 is a photograph taken after particles were transferred to an epoxy film by using the adhesive substrate produced in Example 3.

FIG. 13 is a photograph taken after particles were transferred to an epoxy film by using the adhesive substrate produced in Example 4.

FIG. 14 is a photograph taken after particles were transferred to an epoxy film by using the adhesive substrate produced in Comparative Example 1.

FIG. 15 is a photograph taken after particles were transferred to a silicone adhesive tape by using the adhesive substrate produced in comparative Example 2.

DESCRIPTION OF EMBODIMENTS

The present inventors have diligently investigated to achieve the above objects and consequently found that it becomes possible to selectively pick up a large amount of fine chips and electrically connect the large amount of chips in a short time by pressing the chips to a circuit electrode on a substrate with an adhesive substrate which includes a support base member and an adhesive layer provided on the support base member, and in which the support base member contains electroconductive particles and an insulating resin, and has a recessed and projected pattern with two or more projected portions on one surface or both surfaces of the support base member; the adhesive layer is provided at least on upper surfaces of the projected portions in the recessed and projected pattern of the support base member; and the adhesive layer on the upper surfaces of the projected portions has an upper surface with a curved surface. Moreover, the inventors have found that such an adhesive substrate allows electroconductive nanoparticles to adhere to the adhesive layer and transfers the electroconductive nanoparticles to a different adhesive substrate or the like, so that the electroconductive nanoparticles can be regularly disposed, and an anisotropic conductive substrate can be easily manufactured. These findings have led to the completion of the present invention. Hereinafter, the inventive adhesive substrate, a method for producing the adhesive substrate, and a transfer device will be described in detail.

Specifically, the present invention provides an adhesive substrate comprising:

a support base member; and an adhesive layer provided on the support base member, wherein the support base member contains electroconductive particles and an insulating resin, and has a recessed and projected pattern with two or more projected portions on one surface or both surfaces of the support base member, the adhesive layer is provided at least on upper surfaces of the projected portions in the recessed and projected pattern of the support base member, and the adhesive layer on the upper surfaces of the projected portions has an upper surface with a curved surface.

Adhesive Substrate

A specific embodiment of such an adhesive substrate of the present invention includes an adhesive substrate 100A as shown in FIG. 1(A) in which an adhesive layer 2a is provided only on upper surfaces 1' of projected portions of a support base member 1 which has a recessed and projected pattern with two or more projected portions on one surface or both surfaces of the support base member 1, and the adhesive layer 2a on the upper surfaces 1' of the projected portions has an upper surface with a curved surface. Moreover, another embodiment includes an adhesive substrate 100B as shown in FIG. 1(B) in which the adhesive layer 2a is provided on the upper surfaces 1' of the projected portions of the support base member 1, and an adhesive layer 2b other than the adhesive layer 2a is provided also on a recessed portion(s) in the recessed and projected pattern of the support base member 1 such that a height of an upper surface of the adhesive layer 2b provided on the recessed portion (s) in the recessed and projected pattern is lower than a height of the upper surface of the adhesive layer 2a provided on the upper surfaces 1' of the projected portions. Hereinbelow, the support base member and the adhesive layers in the present invention will be specifically described.

Support Base Member

The support base member 1 used in the present invention is not particularly limited, as long as it contains electroconductive particles and an insulating resin, and has a recessed and projected pattern with two or more projected portions on one surface or both surfaces of the support base member. Particularly, the support base member 1 preferably has an orderly recessed and projected pattern.

The reason that the electroconductive particles are mixed in the present invention is to impart electric conductivity to the insulating resin. The support base member blended with such electroconductive particles is hardly charged with static electricity or the like, and can prevent chip failure due to static electricity, chip scattering by electrostatic repulsion, and so forth. Moreover, when electroconductive nanoparticles are picked up, the particles can be prevented from adhering to the other location than the adhesive layer due to electrostatic force. The electroconductive particles blended into the support base member 1 are not particularly limited, and can be selected appropriately in accordance with the object. Examples thereof include metal particles, electroconductive polymer particles, metal-coated particles, and the like.

Examples of the metal particles include metal simple substances such as gold, silver, copper, palladium, aluminum, nickel, iron, titanium, manganese, zinc, tungsten, platinum, lead, and tin; and alloys such as solder, steel, and stainless steel. These may be used alone or in combination of two or more kinds. Examples of the electroconductive polymer particles include carbon, polyacetylene particles, polypyrrole particles, and the like.

The metal-coated particles may be, for example, resin particles whose surfaces are coated with metal, or inorganic particles, such as glasses or ceramics, whose surfaces are coated with metal. The method for coating the surface with metal is not particularly limited, and examples thereof include an electroless plating method, a sputtering method, and the like.

The electroconductive particles may be blended after the surfaces of the particles are treated with insulating coating.

As the particle size, the electroconductive particles preferably have a median diameter of 0.01 μm to 100 μm. The median diameter is more preferably 0.1 μm to 50 μm, particularly preferably 0.5 μm to 10 μm. With this range, the electroconductive particles can enter the projected portions in the recessed and projected pattern of the support base member. Note that the median diameter of the particles is a value measured with a particle size distribution measuring device by a laser diffraction method.

The amount of the electroconductive particles blended in the support base member is not particularly limited, and the content of the electroconductive particles is preferably 10 to 90 parts by mass, more preferably 15 to 80 parts by mass, further preferably 20 parts by mass to 70 parts by mass, based on 100 parts by mass of a total amount of the electroconductive particles and the insulating resin. With 10 parts by mass or more, the surface of the adhesive substrate can be reliably prevented from being charged with static electricity, and chip failure due to static electricity and chip scattering by electrostatic repulsion can be sufficiently prevented. Moreover, the content of 10 parts by mass or more is preferable because when electroconductive nanoparticles are picked up, the particles will not adhere to the other location than the adhesive layer. Meanwhile, the content of 90 parts by mass or less is preferable because a neat support base member can be prepared.

The insulating resin is not particularly limited, and can be selected appropriately in accordance with the object. Examples thereof include a silicone resin, an epoxy resin, an acrylic resin, a polyester resin, a polyethylene resin, a cellulose resin, a styrene resin, a polyamide resin, a polyimide resin, a melamine resin, a phenol resin, a fluorinated resin, and the like.

The method for forming the recessed and projected pattern is not particularly limited. For example, the recessed and projected pattern may be directly formed in a workpiece containing the electroconductive particles and the insulating resin to prepare the support base member 1.

Alternatively, a mold can be utilized in which a recessed and projected pattern is formed in a workpiece by photolithography. The method for preparing a mold having a recessed and projected pattern by photolithography may follow conventionally known methods. As shown in FIG. 2, a photoresist 4 is applied to a workpiece 3, followed by exposure, development, and etching in this order. Then, the extra resist is washed off, so that a mold 5 having a recessed and projected pattern can be obtained.

Next, a material to be molded is pressed against the mold 5 having the recessed and projected pattern prepared by such a method for the molding. A resin composition containing the electroconductive particles and the insulating resin is poured into the mold. Thus, the support base member 1 having the recessed and projected pattern can be obtained.

Further, the support base member 1 having the recessed and projected pattern in the present invention may be disposed on a different substrate to which an adhesive agent has been applied. In this case, the adhesive agent may be the same as or different from an adhesive agent for forming the adhesive layer provided on the upper surfaces of the projected portions of the support base member 1 in the present invention. Examples of the different substrate include glass, a ceramic substrate, a silicon wafer, a glass-epoxy laminated substrate, a polyimide laminated substrate, a paper phenol substrate, a silicone resin substrate, a fluorinated resin substrate, a polyester substrate, and the like.

The size and interval of the recessed and projected pattern of the support base member 1 are not particularly limited, and can be selected appropriately in accordance with the size of the chips or particles to be picked up. To pick up fine chips and particles, the projected portion shown in FIG. 1 may have a width 101 of 1 μm to 100 μm, preferably 1 μm to 20 μm, more preferably 1 μm to 10 μm.

Here, examples of the shape of the projected portion include circular column, quadrangular column, and the like. The width of the projected portion refers to a diameter in the circular column, or refers to a length of a long side in the quadrangular column.

Moreover, a difference 104 between a height of the upper surfaces of the projected portions of the support base member 1 and a height of a bottom surface(s) of the recessed portion(s) in the recessed and projected pattern of the support base member 1 is preferably 50 to 500% of the width 101 of the projected portion. Such a support base member is preferable because the difference 104 is an adequate distance so that large amounts of fine chips and particles can be selectively transferred more reliably.

Further, depending on the width 101, heights 103a, 103b may be 1 μm to 100 μm, preferably 1 μm to 20 μm, more preferably 1 μm to 10 μm. Herein, the height 103a as shown in FIG. 1(A), the longest distance of a difference between the height of the upper surface of the adhesive layer 2a provided on the upper surfaces of the projected portions of the support base member and the height of the bottom surface(s) of the recessed portion(s) of the support base member. Meanwhile, the height 103b is, as shown in FIG. 1(B), the longest distance of a difference between the height of the upper surface of the adhesive layer provided on the upper surfaces of the projected portions of the support base member and the height of the upper surface of the adhesive layer provided on the recessed portion(s) of the support base member.

Furthermore, the adjacent projected portions may have an interval 102 of 1 μm to 100 μm, preferably 1 μm to 50 μm, more preferably 1 μm to 20 μm. Note that, in the present invention, the width, height, and interval of the projected portions refer to values measured with a scanning electron microscope.

Adhesive Layer

The inventive adhesive substrates 100A, 100B are characterized in that the adhesive layer 2a is provided at least on the upper surfaces 1' of the projected portions in the recessed and projected pattern of the support base member 1, and that the adhesive layer 2a has a curved upper surface. The adhesive substrate having the adhesive layer 2a with such a shape disperses the pressure for pressing when micro chips are picked up, making it possible to reduce the pressure applied to the chips. In addition, the reduction in the adhesion area enables the peeling with low stress. Thus, it is possible to transfer (die-bonding) large amounts of fine chips and particles in a short time. Moreover, although the adhesive layer in the present invention may be also formed on the recessed portion(s) in the recessed and projected pattern of the support base member 1, it is preferable that only the upper surface of the adhesive layer 2a on the upper surfaces of the projected portions in the support base member have the curved surface.

The adhesive force of the adhesive layer is not particularly limited, and the 180-degree peel strength is preferably 0.05 to 50 (N/25 mm width), more preferably 0.1 to 40 (N/25 mm width), and further preferably 0.15 to 30 (N/25 mm width). With these ranges, sufficient adhesiveness is obtained to pick up micro chips, particles, and so forth.

Note that, in the present invention, the adhesive force refers to the peel strength measured when the adhesive layer is peeled according to the method described in JIS Z 0237: 2009 under conditions or temperature: 23° C., peel rate: 300 mm/min, and peel angle: 180°.

The maximum thickness (height) of the adhesive layer is not particularly limited. When the adhesive substrate is pressed to chips or the like, the deformation amount is preferably smaller. Hence, the maximum thickness (height) of the adhesive layer may be 0.01 μm to 100 μm, preferably 0.01 μm to 50 μm, more preferably 0.05 μm to 30 μm.

The adhesive agent for forming the adhesive layer in the present invention is not particularly limited. Examples thereof include adhesive agents that are cured after the application, such as an acrylic adhesive agent, a silicone adhesive agent, a urethane adhesive agent, a latex adhesive agent, an epoxy adhesive agent, and the like.

The method for forming the adhesive layer is not particularly limited, but the adhesive layer on the upper surfaces of the projected portions of the support base member needs to have a curved upper surface. Particularly, as in FIG. 1(A), it is preferable to form the adhesive layer 2a having the curved upper surface only on the upper surfaces of the projected portions of the support base member 1. Optionally, as in FIG. 1(B), it is preferable to form the adhesive layer 2a having the curved upper surface on the upper surfaces 1' of the projected portions of the support base member 1 while the adhesive layer 2b is also formed on the recessed portion(s) in the recessed and projected pattern of the support base member 1 such that the height of the upper surface of the adhesive layer 2b provided on the recessed portion(s) in the recessed and projected pattern is lower than the height of the upper surface of the adhesive layer 2a provided on the upper surfaces of the projected portions.

Hence, if the adhesive agent is merely applied with a spin coater or a typical pressurized spray, the adhesive agent applied on the projected portions of the support base member flows out, and no adhesive layer is formed on the upper surfaces of the projected portions, or the height of the adhesive layer on the recessed portion(s) is the same as the height of the adhesive layer on the projected portions. Consequently, a flat adhesive substrate is formed without the recessed and projected portions, and cannot selectively pick up fine flip chips.

For example, applying an adhesive agent from the top of the projected portions by using fine nozzles, electrostatic application (electrospray), and the like exemplify specific methods for forming: the adhesive layer 2a having the curved upper surface only on the upper surfaces 1' of the projected portions of the support base member 1 (FIG. 1(A)); optionally, the adhesive layer 2b also on the recessed portion(s) in the recessed and projected pattern of the support base member 1 such that the height of the upper surface of the adhesive layer 2b provided on the recessed portion (s) in the recessed and projected pattern is lower than the height of the upper surface of the adhesive layer 2a having the curved surface provided on the upper surfaces of the projected portions (FIG. 1(B)).

Particularly, the electrostatic application is preferable. Since this method applies a positively- or negatively-charged adhesive agent to the base member by the attraction of static electricity, a large proportion of the adhesive agent is applied to a spot where the distance between a nozzle and the base member is short; thus, the adhesive agent can be applied in a short time without precise control so that the adhesive layer 2a having the curved upper surface can be formed only on the upper surfaces 1' of the projected portions of the support base member 1; alternatively, the adhesive layers 2a, 2b can be formed such that the height of the upper surface of the adhesive layer 2b provided on the recessed portion(s) in the recessed and projected pattern is lower than the height of the upper surface of the adhesive layer 2a having the curved upper surface provided on the upper surfaces of the projected portions.

The shape of the nozzle is not particularly limited, but is desirably a circular shape in order to apply voltage uniformly to the dispersion. The diameter of the nozzle is not particularly limited, and can be selected appropriately in accordance with the width and interval of the pattern. The diameter of the nozzle may be 5 μm to 500 μm, preferably 10 μm to 300 μm, more preferably 20 μm to 100 μm, in order to, for example, form the adhesive layer on a projected pattern in which the projected portions have a width of 10 μm and an interval of 10 μm, and the height difference is 10 μm between upper surfaces of the projected portions and bottom surfaces of recessed portions.

With these ranges, the adhesive agent can be applied in such a manner that the adhesive layer 2a having the curved upper surface is formed only on the upper surfaces of the projected portions of the support base member 1; alternatively, the adhesive layers 2a, 2h are formed such that the height of the upper surface of the adhesive layer 2b provided on the recessed portion(s) of the support base member 1 is lower than the height of the upper surface of the adhesive layer 2a having the curved upper surface provided on the upper surfaces of the projected portions.

The voltage applied thereto is not particularly limited, but is for example 1,000 V to 10,000 V, preferably 1,000 V to 8,000 V, more preferably 1,000 V to 5,000 V. Additionally, the distance between the tip of the nozzle and the support base member is for example 10 μm to 3,000 μm, preferably 10 μm to 2,000 μm.

The curing method of the adhesive layer varies in accordance with the kind of the resin and is not particularly limited. Examples thereof include heat-curing, photo-curing, moisture-curing, and the like.

Transfer Device

Since the inventive adhesive substrate is capable of selectively picking up a large amount of fine chips and die-bonding a large amount of chips in a short time, the adhesive substrate can be suitably utilized as a bonding head in a device for transferring micro LEDs.

Moreover, the inventive adhesive substrate is also useful as a jig (transferring member) of a transfer device for manufacturing an anisotropic conductive substrate, the jig being configured to selectively pick up electroconductive nanoparticles and transfer them onto a different adhesive substrate, adhesive tape, or the like to dispose them at equal intervals.

An example of the transfer device of the present invention will be described below. For example, the device is configured as follows. Micro LEDs disposed on a dicing tape are conveyed on a conveyor. The adhesive substrate is pressed onto the micro LEDs at a pressure of 0.01 kPa to 100 MPa, preferably 0.05 kPa to 10 MPa, more preferably 0.1 MPa to 1 MPa. The micro LEDs are picked up, and the adhesive substrate is moved to a different conveyor. The adhesive substrate is pressed to a substrate with an adhesiveness or uncured surface, which is, being conveyed on this conveyor, at a pressure of 0.01 kPa to 100 MPa, preferably 0.05 kPa to 10 MPa, more preferably 0.1 MPa to 1 MPa, to transfer the micro LEDs.

Another example includes the following device. Micro LEDs and a substrate with an adhesiveness or uncured surface are disposed on the same conveyor at equal intervals. The adhesive substrate shaped in a roll form is pressed onto the micro LEDs at the maximum pressure of 0.01 kPa to 100 MPa, preferably 0.05 kPa to 10 MPa, more preferably 0.1 MPa to 1 MPa. The micro LEDs are picked up, and the adhesive substrate is then pressed to the substrate with an adhesiveness or uncured surface, which is being conveyed, at the maximum pressure of 0.01 kPa to 100 MPa, preferably 0.05 kPa to 10 MPa, more preferably 0.1 MPa to 1 MPa, for the transfer.

EXAMPLE

Hereinafter, the present invention will be described in more details by showing Examples and Comparative Examples. However, the present invention is not limited to the following Examples. Note that the following epoxy resin composition used in Examples is a composition obtained by mixing 49 parts by mass of a bisphenol A epoxy resin (manufactured by Mitsubishi Chemical Corporation: jER-828EL), 49 parts by mass of an alicyclic epoxy resin (manufactured by DAICEL CORPORATION: CELLOX-IDE 20219), and 2 parts by mass of an imidazole-based curing accelerator (manufactured by Tokyo Chemical Industry Co., Ltd.: 2-ethyl-4-methylimidazole), and adding electroconductive particles to the mixed preparation. The amount of the electroconductive particles blended to be described below is a blended amount, given that the entire resin composition was 100 parts by mass.

Example 1

As shown in FIG. 2, a photoresist film 4 was formed on a silicon wafer (workpiece 3) on which an oxide film had been formed. By employing a known photolithographic method, a recessed and projected pattern was formed such that projected portions had a width of 30 μm and an interval of 30 μm, and the height difference was 30 μm between upper surfaces of the projected portions and bottom surfaces of recessed portions. Thus, a mold 5 was prepared. Into the mold, an addition-cure dimethyl silicone resin composition (manufactured by Shin-Etsu Chemical Co., Ltd.) was poured and cured by heating at 150° C. for 4 hours. The cured product was separated from the silicon wafer, so that a silicone resin mold was prepared whose recessed and projected pattern was the opposite of that in the silicon wafer. Next, into the prepared silicone resin mold, an epoxy resin composition containing 20 parts by mass of carbon black was poured and cured by heating at 100° C. for 1 hour, and then at 150° C. for 2 hours. The resultant was separated, so that a support base member was prepared which was made of the carbon black-containing epoxy resin and had the same recessed and projected pattern as the original silicon wafer. Next, as an adhesive layer, an addition-cure silicone adhesive agent KR-3700 (manufactured by Shin-Etsu Chemical Co., Ltd., adhesive force: 8.7 N/25 mm) was diluted to have a solid concentration of 30 mass % using a butyl acetate/isopropyl alcohol (50/50) mixture solution. The adhesive agent was applied to the upper surfaces of the projected portions in the recessed and projected pattern using electrostatic atomization/dispensing experimental equipment (manufactured by APIC YAMADA CORPORATION). Thus, an adhesive substrate was produced which had the adhesive layer with a curved surface on the upper surfaces of the projected portions (FIG. 3). The adhesive layer had a maximum thickness of 10 μm.

Example 2

By the same method as in Example 1, in a silicon wafer (workpiece 3) on which an oxide film had been formed, a recessed and projected pattern was formed such that projected portions had a width of 20 μm and an interval of 50 μm, and the height difference was 40 μm between upper surfaces of the projected portions and bottom surfaces of recessed portions. Thus, a mold was prepared. Into the mold, an addition-cure dimethyl silicone resin (manufactured by Shin-Etsu Chemical Co., Ltd.) was poured and cured by heating at 150° C. for 4 hours. The cured product was separated from the silicon wafer, so that a silicone resin mold was prepared whose recessed and projected pattern was the opposite of that in the silicon wafer. Into the prepared silicone resin mold, an epoxy resin composition containing 80 parts by mass of carbon black was poured and cured by heating at 100° C. for 1 hour, and then at 150° C. for 2 hours. The resultant was separated, so that a support base member was prepared which was made of the carbon black-containing epoxy resin and had the same recessed and projected pattern as the original silicon wafer. Next, an addition-cure silicone adhesive agent X-40-3270-1 (manufactured by Shin-Etsu Chemical Co., Ltd., adhesive force: 0.15 N/25 mm) was diluted to have a solid concentration of 20 mass % using a butyl acetate/isopropyl alcohol (50/50) mixture solution. The adhesive agent was applied to the upper surfaces of the projected portions in the recessed and projected pattern using electrostatic atomization/dispensing experimental equipment (manufactured by APIC YAMADA CORPORATION). Thus, an adhesive substrate was produced which had the adhesive layer with a curved surface on the upper surfaces of the projected portions (FIG. 4). The adhesive layer had a maximum thickness of 8 μm.

Example 3

By the same method as in Example 1, in a silicon wafer (workpiece 3) on which an oxide film had been formed, a recessed and projected pattern was formed such that projected portions had a width of 50 μm and an interval of 100 μm, and the height difference was 70 μm between upper surfaces of the projected portions and bottom surfaces of recessed portions. Thus, a mold was prepared. Into the mold, a thermosetting liquid fluoroelastomer (product name: X-71-359 (manufactured by Shin-Etsu Chemical Co., Ltd.)) was poured and cured by heating at 150° C. for 2 hours. The resultant was separated, so that a fluoroelastomer mold was prepared whose recessed and projected pattern was the opposite of that in the silicon wafer. Into the prepared fluoroelastomer mold, a silicone resin composition containing 50 parts by mass of a silver-plated acrylic powder was poured and cured by heating at 150° C. for 4 hours. The resultant was separated, so that a support base member was prepared which was made of the silicone resin and had the same recessed and projected pattern as the original silicon wafer. Next, as an adhesive layer, an acrylic resin-based adhesive agent ORIBAIN BPW6570 (manufactured by TOYOCHEM CO., LTD., adhesive force: 25.6 N/25 mm) was diluted to have a solid concentration of 10 mass % using methyl ethyl ketone (MEK). The adhesive agent was applied to the upper surfaces of the projected portions in the recessed and projected pattern using electrostatic atomization/dispensing experimental equipment (manufactured by APIC YAMADA CORPORATION). Thus, an adhesive substrate was produced which had the adhesive layer with a curved surface on the upper surfaces of the projected portions (FIG. 5). The adhesive layer had a maximum thickness of 20 μm.

Example 4

By the same method as in Example 1, in a silicon wafer substrate, a recessed and projected pattern was formed such that projected portions had a width of 40 μm and an interval of 50 μm, and the height difference was 100 μm between upper surfaces of the projected portions and bottom surfaces of recessed portions. Thus, a mold was prepared. Into the mold, the fluoroelastomer was poured and cured by heating at 150° C. for 2 hours. The resultant was separated, so that a fluoroelastomer mold was prepared whose recessed and projected pattern was the opposite of that in the silicon wafer. Into the prepared mold, a phenol resin composition containing 50 parts by mass of titanium dioxide coated with a tin dioxide/antimony electroconductive layer was poured and cured by heating at 150° C. for 1 hour. The resultant was separated, so that a support base member was prepared which was made of the phenol resin and had the same recessed and projected pattern as the original silicon wafer. Next, as an adhesive layer, the acrylic resin-based adhesive agent ORIBAIN BPW6570 was diluted to have a solid concentration of 10 mass % using methyl ethyl ketone. The adhesive agent was applied to the upper surfaces of the projected portions in the recessed and projected pattern using the electrostatic atomization/dispensing experimental equipment. Thus, an adhesive substrate was produced which had the adhesive layer with a curved surface on the projected portions (FIG. 6). The adhesive layer had a maximum thickness of 20 μm.

Example 5

By the same method as in Example 1, in a silicon wafer substrate, a recessed and projected pattern was formed such that projected portions had a width of 30 μm and an interval of 30 μm, and the height difference was 10 μm between upper surfaces of the projected portions and bottom surfaces of recessed portions. Thus, a mold was prepared. Into the mold, an addition-cure dimethyl silicone resin (manufactured by Shin-Etsu Chemical Co., Ltd.) was poured and cured by heating at 150° C. for 4 hours. The resultant was separated, so that a silicone resin mold was prepared whose recessed and projected pattern was the opposite of that in the silicon wafer. Into the prepared silicone resin mold, an epoxy resin composition containing 30 parts by mass of carbon black was poured and cured by heating at 100° C. for 1 hour, and then at 150° C. for 2 hours. The resultant was separated, so that an epoxy resin base member was prepared which had the same recessed and projected pattern as the original silicon wafer. Next, as an adhesive layer, an addition-cure silicone adhesive agent X-40-3270-1 (manufactured by Shin-Etsu. Chemical Co., Ltd., adhesive force: 0.15 N/25 mm) was diluted to have a solid concentration of 20 mass % using a butyl acetate/isopropyl alcohol (50/50) mixture solution. The adhesive agent was applied to the recessed and projected pattern using the electrostatic atomization/dispensing experimental equipment. Thus, an adhesive substrate was produced which had the adhesive layer with a curved upper surface on the projected pattern (FIG. 7). The adhesive layer had a maximum thickness of 5 μm.

Comparative Example 1

By the same method as in Example 1, in a silicon wafer (workpiece 3) on which an oxide film had been formed, a recessed and projected pattern was formed such that projected portions had a width of 30 μm, a height of 30 μm, and an interval of 30 μm. Thus, a mold was prepared. Into the mold, an addition-cure dimethyl silicone resin (manufactured by Shin-Etsu Chemical Co., Ltd.) was poured and cured by heating at 150° C. for 4 hours. The resultant was separated, so that a silicone resin mold was prepared whose recessed and projected pattern was the opposite of that in the silicon wafer. Into the prepared mold, an epoxy resin containing no electroconductive particles was poured and cured by heating at 100° C. for hour, and then at 150° C. for 2 hours. The resultant was separated, so that a support base member was prepared which was made of the epoxy resin and had the same recessed and projected pattern as the original silicon wafer. Next, as an adhesive layer, an addition-cure silicone adhesive agent KR-3700 (manufactured by Shin-Etsu Chemical Co., Ltd., adhesive force: 8.7 N/25 mm) was diluted to have a solid concentration of 30 mass % using a butyl acetate/isopropyl alcohol (50/50) mixture solution. The adhesive agent was applied to the recessed and projected pattern using the electrostatic atomization/dispensing experimental equipment. Thus, an adhesive substrate was produced which had the adhesive layer with a curved surface on the projected pattern (FIG. 8). The adhesive layer had a maximum thickness of 10 μm.

Comparative Example 2

Under the same conditions as in Example 1, the adhesive agent was applied to the recessed and projected pattern of the support base member made of the epoxy resin, except for the method for applying the adhesive agent: a hand spray gun was used instead of the electrostatic atomization/dispensing experimental equipment. Consequently, an adhesive substrate was obtained in which the recessed pattern was filled with the adhesive layer, the adhesive layer surface was flat, and no recessed and projected pattern was formed (FIG. 9).

Adhesion Test

Using the adhesive substrates obtained in Examples 1 to 5 and Comparative Examples 1 to 2, silver nanoparticles scattered on a PET film were transferred to a silicone adhesive tape or an epoxy film. The silver nanoparticles had been surface-treated with an insulating resin.

When the adhesive substrates prepared in Examples 1 to 5 were used, the silver nanoparticles were selectively picked up and transferred onto the adhesive tape or the film. Particularly, in each of Examples 1 to 4, the height of the projected pattern of the support base member (the difference between the height of the upper surfaces of the projected portions and the height of the bottom surfaces of the recessed portions) was 50% or more of the long side of the upper portion of the projected pattern (the width of each projected portion). As a result, the recessed and projected portions were adequate, and the silver nanoparticles were regularly transferred onto the adhesive tape (FIGS. 10 to 13).

When the adhesive substrate produced in Comparative Example 1 was used, since the adhesive substrate contained no electroconductive particles, the adhesive substrate was charged with static electricity. When the silver nanoparticles surface-treated with the insulating resin were picked up, the silver nanoparticles were attached also to the recessed pattern portions by the static electricity, and not selectively picked up or regularly transferred onto the film (FIG. 14).

When the adhesive substrate produced in Comparative Example 2 was used, since the adhesive substrate had no recessed and projected pattern, the silver nanoparticles were attached to the entire substrate, and not selectively picked up or regularly transferred onto the adhesive tape (FIG. 15).

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. An adhesive substrate comprising:
a support base member; and
an adhesive layer provided on the support base member,
wherein the support base member contains electroconductive particles and an insulating resin, and has a recessed and projected pattern with two or more projected portions on one surface or both surfaces of the support base member,
the adhesive layer is provided at least on upper surfaces of the projected portions in the recessed and projected pattern of the support base member, and
the adhesive layer on the upper surfaces of the projected portions has an upper surface with a curved surface.

2. The adhesive substrate according to claim 1, wherein a difference between a height of the upper surfaces of the projected portions of the support base member and a height of a bottom surface of a recessed portion in the recessed and projected pattern of the support base member is 50 to 500% of a width of the projected portions.

3. The adhesive substrate according to claim 1, wherein the projected portions adjacent to each other in the recessed and projected pattern of the support base member have an interval of 1 μm to 100 μm.

4. The adhesive substrate according to claim 2, wherein the projected portions adjacent to each other in the recessed and projected pattern of the support base member have an interval of 1 μm to 100 μm.

5. The adhesive substrate according to claim 1, wherein the projected portions in the recessed and projected pattern of the support base member each have a width of 1 μm to 100 μm.

6. The adhesive substrate according to claim 2, wherein the projected portions in the recessed and projected pattern of the support base member each have a width of 1 μm to 100 μm.

7. The adhesive substrate according to claim 3, wherein the projected portions in the recessed and projected pattern of the support base member each have a width of 1 μm to 100 μm.

8. The adhesive substrate according to claim 4, wherein the projected portions in the recessed and projected pattern of the support base member each have a width of 1 μm to 100 μm.

9. The adhesive substrate according to claim 1, wherein the adhesive layer is provided only on the upper surfaces of the projected portions in the recessed and projected pattern of the support base member.

10. The adhesive substrate according to claim 2, wherein the adhesive layer is provided only on the upper surfaces of the projected portions in the recessed and projected pattern of the support base member.

11. The adhesive substrate according to claim 1, wherein the adhesive layer is provided also on the recessed portion of the support base member such that a height of an upper surface of the adhesive layer provided on the recessed portion is lower than a height of the upper surface of the adhesive layer provided on the upper surfaces of the projected portions.

12. The adhesive substrate according to claim 9, wherein a difference between a height of the upper surface of the adhesive layer provided on the upper surfaces of the projected portions of the support base member and the height of the bottom surface of the recessed portion is at most 1 μm to 100 μm.

13. The adhesive substrate according to claim 10, wherein a difference between a height of the upper surface of the adhesive layer provided on the upper surfaces of the projected portions of the support base member and the height of the bottom surface of the recessed portion is at most 1 μm to 100 μm.

14. The adhesive substrate according to claim 11, wherein a difference between the height of the upper surface of the adhesive layer provided on the upper surfaces of the projected portions of the support base member and the height of the upper surface of the adhesive layer provided on the recessed portion of the support base member is at most 1 μm to 100 μm.

15. The adhesive substrate according to claim 1, wherein the adhesive layer has a maximum thickness of 0.01 μm to 100 μm.

16. The adhesive substrate according to claim 1, wherein the support base member contains 10 to 90 parts by mass of the electroconductive particles based on 100 parts by mass of a total amount of the electroconductive particles and the insulating resin.

17. The adhesive substrate according to claim 1, wherein the electroconductive particles have a median diameter of 0.01 μm to 100 μm measured with a particle size distribution measuring device by a laser diffraction method.

18. The adhesive substrate according to claim 1, wherein the adhesive layer has an adhesive force of 0.05 to 50 (N/25 mm width), the adhesive force being measured when the adhesive layer is peeled in accordance with JIS Z 0237: 2009 under conditions of 23° C., a peel angle of 180°, and a peel rate of 300 mm/min.

19. A transfer device comprising the adhesive substrate according to claim 1 as a transferring member.

20. A method for producing the adhesive substrate according to claim 1, comprising applying an adhesive agent through a nozzle by electrostatic force to form the adhesive layer at least on the upper surfaces of the projected portions of the support base member.

* * * * *